(12) United States Patent
Zhang et al.

(10) Patent No.: US 12,021,545 B2
(45) Date of Patent: Jun. 25, 2024

(54) DATA INTERLEAVER FOR BURST ERROR CORRECTION

(71) Applicant: SK hynix Inc., Icheon-si (KR)

(72) Inventors: Fan Zhang, Fremont, CA (US); Hongwei Duan, San Jose, CA (US); Haobo Wang, Sunnyvale, CA (US)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/934,910

(22) Filed: Sep. 23, 2022

(65) Prior Publication Data

US 2024/0106460 A1    Mar. 28, 2024

(51) Int. Cl.
*H03M 13/11* (2006.01)
*H03M 13/00* (2006.01)

(52) U.S. Cl.
CPC ...... *H03M 13/1111* (2013.01); *H03M 13/611* (2013.01)

(58) Field of Classification Search
CPC ..................... H03M 13/1111; H03M 13/611
See application file for complete search history.

(56) References Cited

U.S. PATENT DOCUMENTS

| | | | |
|---|---|---|---|
| 5,809,260 A | 9/1998 | Bredin | |
| 6,202,178 B1 | 3/2001 | Spruyt | |
| 6,662,332 B1 | 12/2003 | Kimmitt | |
| 6,981,197 B2 | 12/2005 | Liu et al. | |
| 7,076,721 B2 | 7/2006 | Sawaguchi | |
| 7,146,545 B2 | 12/2006 | Ohbuchi et al. | |
| 7,447,984 B2 | 11/2008 | Cameron et al. | |
| 8,099,653 B2 | 1/2012 | Kanda et al. | |
| 8,416,519 B2 | 4/2013 | Fry et al. | |
| 9,924,208 B2 | 3/2018 | Lee et al. | |
| 2021/0391945 A1* | 12/2021 | Chaki | H03M 13/15 |
| 2022/0303051 A1* | 9/2022 | Luo | H04L 1/0071 |
| 2023/0011884 A1* | 1/2023 | Roh | H03M 13/611 |
| 2023/0275690 A1* | 8/2023 | Zhao | H04L 1/1642 370/329 |

* cited by examiner

*Primary Examiner* — Thien Nguyen
(74) *Attorney, Agent, or Firm* — Weaver Austin Villeneuve & Sampson LLP

(57) ABSTRACT

To improve error correction when errors occur in consecutive bits of user data, the user data can be stored in an interleaved manner. Data of a data unit can be interleaved to generate a permutated data unit. A checksum of the permutated data unit can then be calculated, and an error correction code can be generated over the data unit and the checksum. The error correction code can also be interleaved to generate a permutated error correction code. The permutated data unit, the checksum, and the permutated error correction code can then be concatenated to generate a storage data unit for storage in a memory.

20 Claims, 12 Drawing Sheets

$$H = \begin{bmatrix} 1 & 0 & 1 & 0 & 0 & 1 \\ 1 & 1 & 0 & 0 & 1 & 0 \\ 1 & 0 & 0 & 1 & 0 & 0 \\ 0 & 1 & 0 & 1 & 0 & 1 \end{bmatrix}$$

Variable Nodes    Check Nodes

DATA INTERLEAVER FOR BURST ERROR CORRECTION

BACKGROUND

Error-correction codes (ECCs) are frequently used for various types of data storage devices such as NAND flash memories. ECCs are also frequently used during the process of data transmission. ECC refers to codes that add redundant data, or parity data, to a message, such that the message can be recovered by a receiver equipped with a decoder, even when one or more errors were introduced, either during the process of transmission, or storage. In general, an ECC decoder can correct a limited number of errors, with the number depending on the type of code used and/or the error correction capability of the decoder itself. Low-density parity-check (LDPC) codes are an example of ECC. In ECC decoding, including LDPC decoding, there is often a tradeoff between error correction capability (e.g., number of bits that can be corrected) and computation cost (e.g., power consumption or processing time). Generally, the higher the error correction capability, the more complex the decoding processing and the higher the power consumption and/or processing time.

BRIEF SUMMARY

Techniques for improving error correction for burst errors are described. To improve error correction when the errors occur in consecutive bits of user data, the user data can be stored in an interleaved manner. According to some embodiments, data of a data unit can be interleaved to generate a permutated data unit. A checksum of the permutated data unit can then be calculated, and an error correction code can be generated over the data unit and the checksum. The error correction code can also be interleaved to generate a permutated error correction code. The permutated data unit, the checksum, and the permutated error correction code can then be concatenated to generate a storage data unit for storage in a memory.

According to some embodiments, when a storage data unit is retrieved from a memory, the permutated data unit and the permutated error correction code in the storge data unit can be deinterleaved to generate a deinterleaved data unit and a deinterleaved error correction code. An error decoding operation (e.g., LDPC error decoding) can be performed on the deinterleaved data unit and the checksum using the deinterleaved error correction code to generate a decoded data unit and decoded checksum. The decoded data unit can then be interleaved to generate a permutated decoded data unit such that a verification checksum can be computed over the permutated decoded data unit. The verification checksum can be compared with the decoded checksum to determine whether the decoded data unit corresponds to valid data.

According to some embodiments, a storage device may include a memory and a controller coupled to the memory. The controller is operable to receive a data unit for storing into the memory, perform interleaving of data in the data unit to generate a permutated data unit, calculate a checksum of the permutated data unit. The controller is also operable to generate an error correction code over the data unit and the checksum, and interleave the error correction code to generate a permutated error correction code. The permutated data unit, the checksum, and the permutated error correction code can be concatenated together to generate a storage data unit, and the storage data unit can then be written into the memory of the storage device.

BRIEF DESCRIPTION OF THE DRAWINGS

Various embodiments in accordance with the present disclosure will be described with reference to the drawings, in which.

DETAILED DESCRIPTION

Error correction codes (ECC) such as low-density parity-check (LDPC) codes have excellent random error correction capability, when the parity-check matrix and decoders are properly designed. However, the error correction capability can degrade significantly when burst error happens (consecutive bits containing errors). As compared to random errors, burst errors can cause the error capability to fall far below the random error correction capability.

To mitigate against burst errors, the techniques disclosed herein provide a multilevel interleaver to convert the burst error in the media (including data transfer) domain into random-like errors in the decoder domain. The multilevel interleaver may incur minimal latency and gate count overhead, and provides cyclic redundancy check (CRC) termination during decoding to support decoders of irregular codes. For ease of explanation, the multilevel interleaver techniques will be described below in the context of storing data in a storage device. However, it should be understood the techniques can also be used to improve burst error recovery for data transmission.

In the description provided herein, for the purposes of explanation, specific details are set forth in order to provide a thorough understanding of certain inventive embodiments.

However, it will be apparent that various embodiments may be practiced without these specific details. Hence, the figures and description are not intended to be restrictive.

Figure 1:
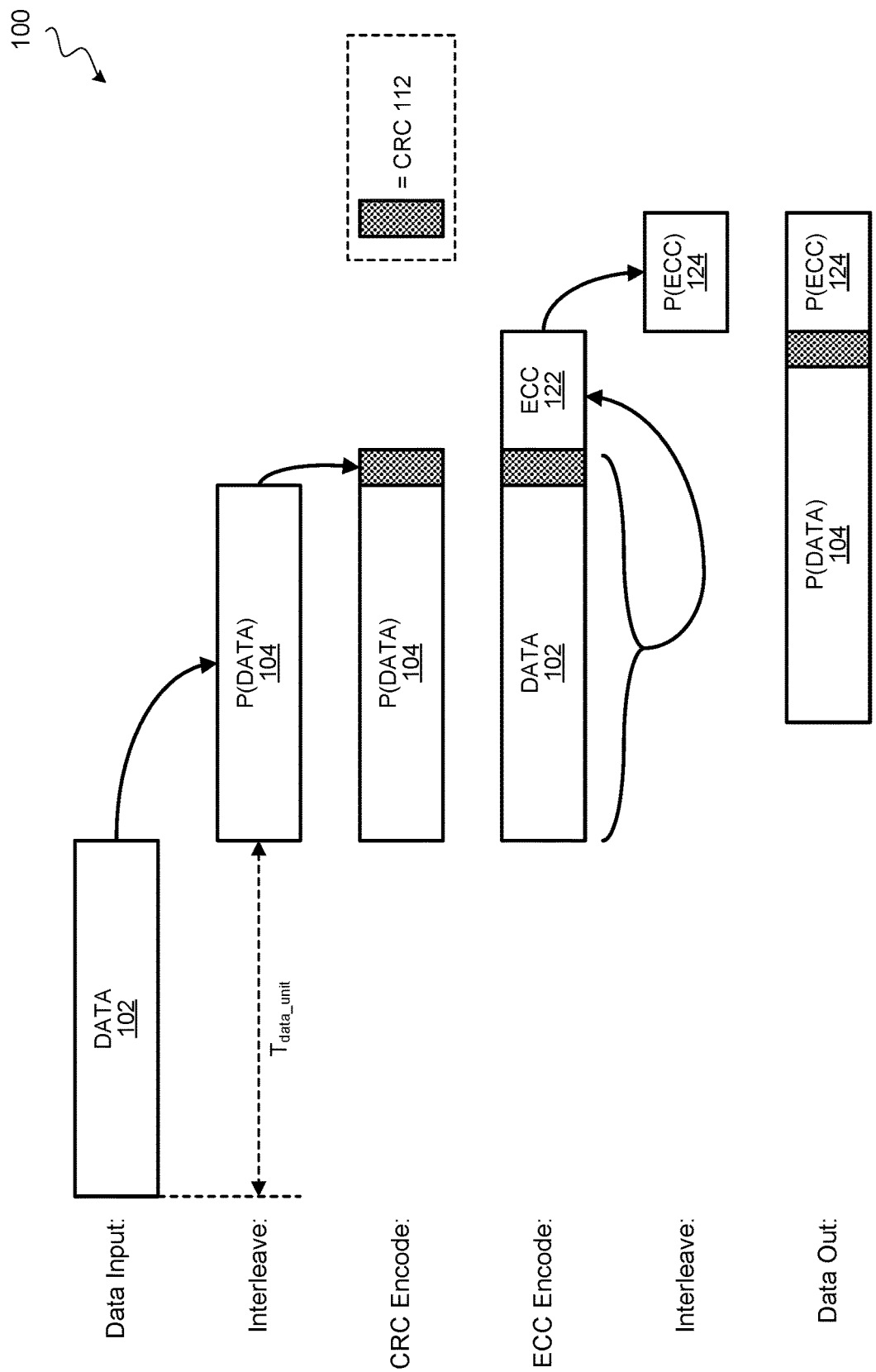
FIG. 1 illustrates a conceptual diagram of preparing data for storing to a storage device, according to some embodiments.

FIG. 1 illustrates a conceptual diagram 100 of preparing data for storing to a storage device, according to some embodiments. The data preparation process can be performed, for example, by a memory controller coupled between a host computing device and a storage device. DATA 102 represents input data that is being stored to a storage device. DATA 102 can be, for example, data from a host application executing on the host computing device. The size (e.g., number of bytes) of DATA 102 may correspond to the size of a data block used for a codeword of the ECC scheme.

To prepare the DATA 102 for storage, DATA 102 can be interleaved or shuffled to rearrange the sequence of data bits to generate a permutated data unit P(DATA) 104. In some implementations, a multi-level interleaver can be used to introduce pseudo-randomness in the ordering of data bits in DATA 102. The multi-level interleaver can be a k-level interleaver in which k is an integer greater than one. For example, a two-level interleaver (k=2) can be used to splits DATA 102 into multiple data segments that each includes multiple data portions. The data segments can be interleaved at the first level of interleaving to rearrange the order of the data segments, and each of the data segments themselves can be interleaved at the second level of interleaving to rearrange the data portions within each interleaved data segment. It should be noted that the multi-level interleaving operation may incur a latency $T_{data\_unit}$ for receiving the data size of DATA 102, because generation of the permutated data unit P(DATA) 104 may not be completed until the entire DATA 102 is received. The size of DATA 102 may also correspond to the size of the data buffer being implemented to generate the permutated data unit P(DATA) 104.

After the permutated data unit P(DATA) 104 is generated, a checksum is calculated over the permutated data unit P(DATA) 104. For example, a cyclic redundancy check (CRC) encoding process can be performed to generate a CRC value 112 over the permutated data unit P(DATA) 104. An error correction code (ECC) 122 is then generated over the concatenation of the original data unit DATA 102 and CRC 112. ECC 122 can be, for example, a low-density parity-check (LDPC) code. The generated ECC 122 is then itself interleaved to generate a permutated ECC P(ECC) 124. In addition to interleaving the original data unit DATA 102, ECC 122 is also interleaved because it may be possible for consecutive error bits to occur in the ECC data itself. The final data output that is written to the storage device as a storage data unit can be the concatenation of the permutated data unit P(DATA) 104, the checksum (e.g., CRC value 112), and the permutated ECC P(ECC) 124. The storage data unit can then be stored in a memory of a storage device. The storage device can be, for example, a solid-state drive (SSD) implemented using flash memories such as NAND flash memories.

Figure 2:
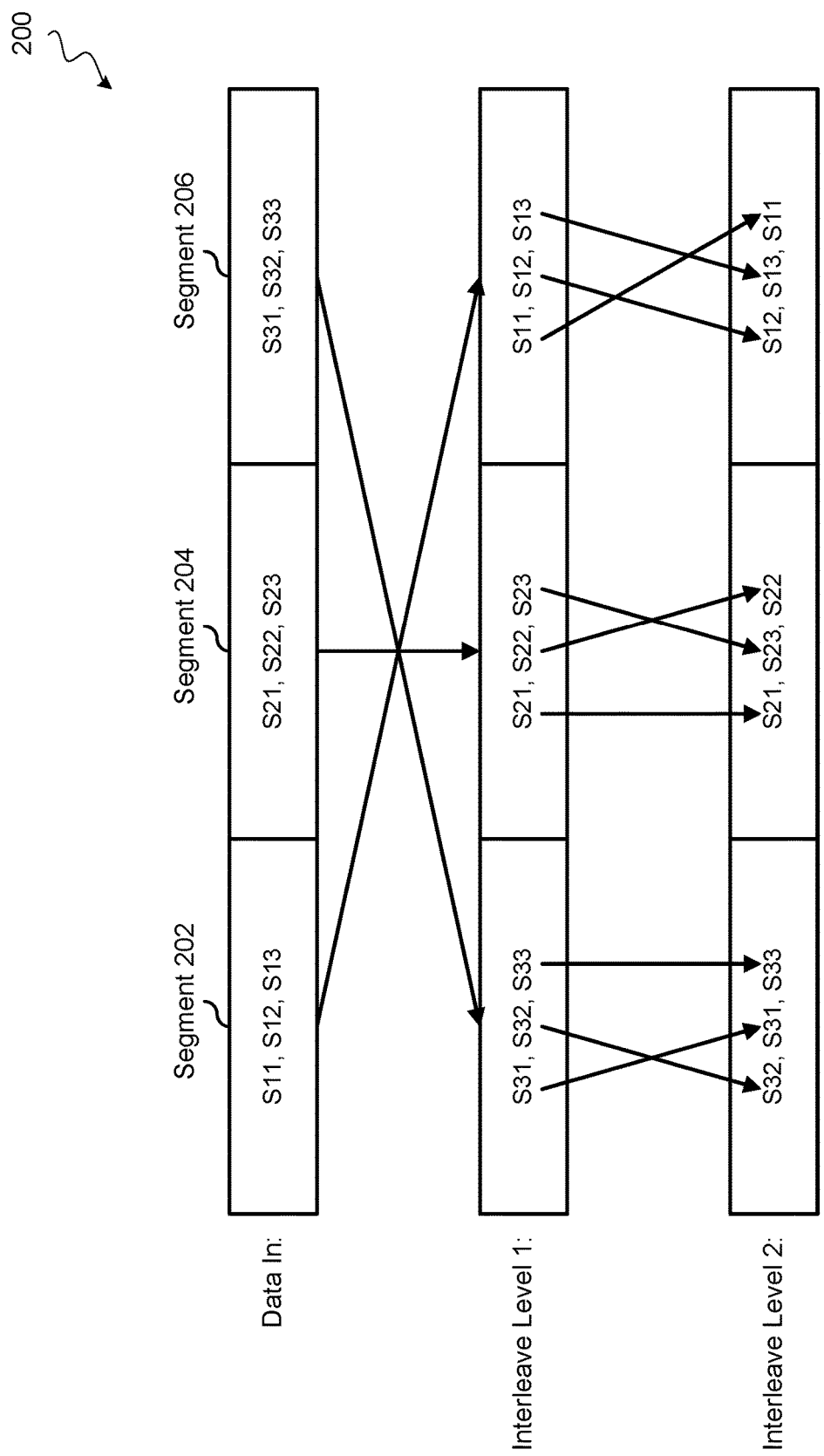
FIG. 2 illustrates a conceptual diagram of a data interleaver operation, according to some embodiments.

FIG. 2 illustrates a conceptual diagram 200 of a 2-level interleaver, according to some embodiments. Data input (e.g., a data unit) intended to be stored in a storage device can be segmented into data segments 202, 204, and 206. Each of the data segments 202, 204, and 206 may include three data portions. For example, data segment 202 may include data portions S11, S12, and S13; data segment 204 may include data portions S21, S22, and S23; and data segment 206 may include data portions S31, S32, and S33. It should be understood that in other embodiments, a data unit can be segmented into a different number of data segments, and/or each of the data segments may include a different number of data portions.

At interleave level one, data segments 202, 204, and 206 are shuffled and rearranged according to a prescribed algorithm. For example, the third data segment 206 can be rearranged to be ordered first, the second data segment 204 can retain its position in the middle, and the first data segment 202 can be rearranged to follow the second data segment 204 as shown in FIG. 2. For a 2-level interleaver, the interleaved data of interleave level one is further interleaved to rearrange the data portions of each data segment.

By way of example, data segment 206 (which appears first in the interleaved data of interleave level one) can be further interleaved to rearrange data portions S31, S32, and S33 of data segment 206. At interleave level two, data portions S31, S32, and S33 can be shuffled, and be rearranged into the order of S32, S31, and S33. Data portions S21, S22, and S23 can be shuffled, and be rearranged into the order of S21, S23, and S2. Data portions S11, S12, and S13 can be shuffled, and be rearranged into the order of S12, S13, and S11. Hence, the permutated data unit generated by the two-level interleaver may have a data portion ordering of S32, S31, S33, S21, S23, S22, S12, S13, and S11. It should be understood that the shuffling/rearrangement order of the data portions can be different in other embodiments.

Figure 3:
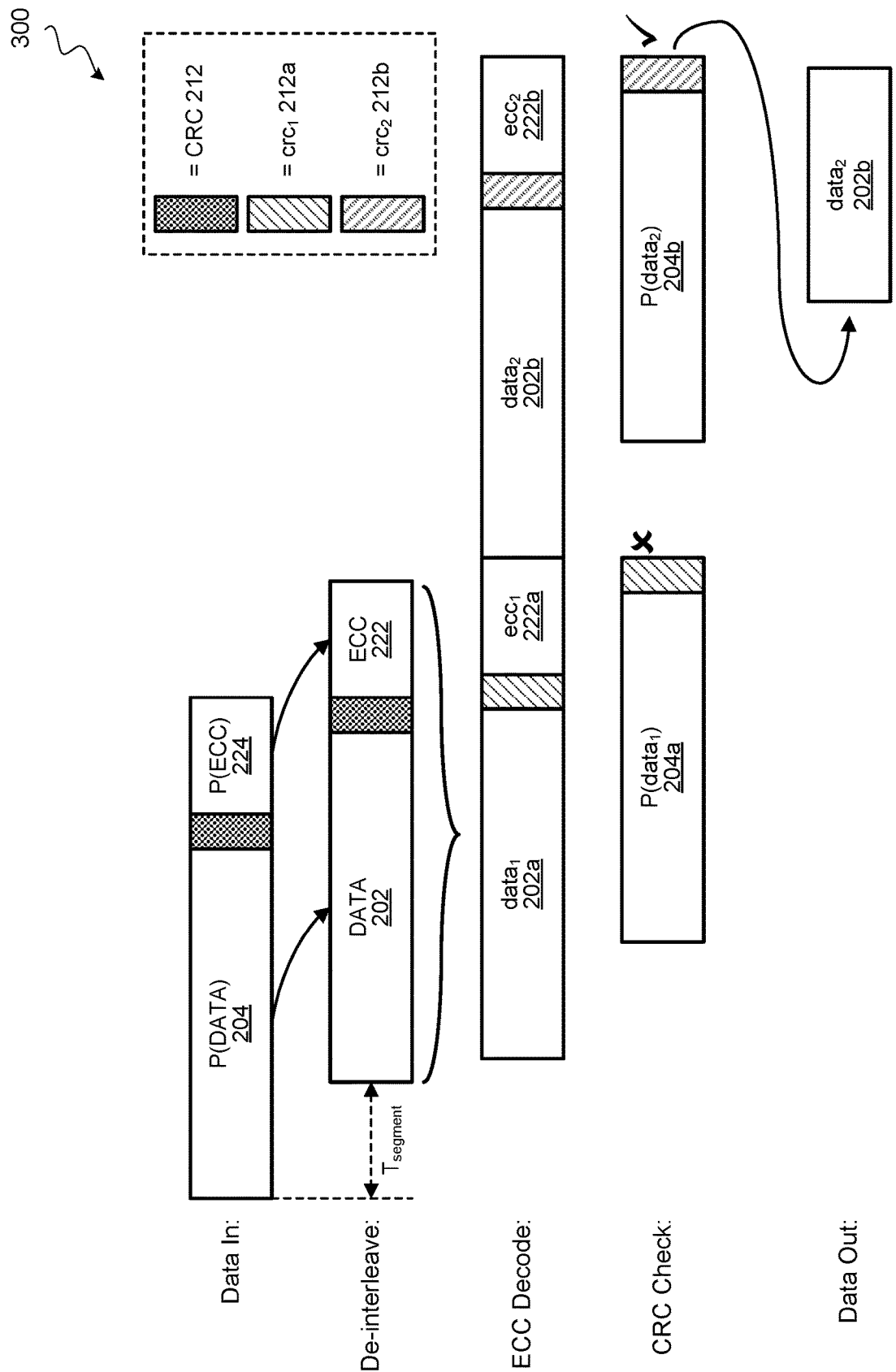
FIG. 3 illustrates a conceptual diagram of retrieving data from a storage device, according to some embodiments.

FIG. 3 illustrates a conceptual diagram 300 of retrieving data from a storage device, according to some embodiments. The data retrieval process can be performed, for example, by a memory controller coupled between a host computing device and a storage device. A storage data unit stored in the memory of a storage device can be read out from the storage device. The storage data unit may include a permutated data unit P(DATA) 204, a checksum such as a CRC value 212, and a permutated error correction code P(ECC) 224. One or more data bits of the storage data unit may contain an error in which the bit value has changed from the original data bit that was written to the storage device. The error may occur, for example, due to a physical defect of the memory, an environmental condition such as excessive temperature (too hot or too cold) or insufficient voltage (too low or too high), or other factors such as aging of the memory.

The data retrieval process may include deinterleaving the permutated data unit P(DATA) 204 and the permuted error correction code P(ECC) 224 to generate deinterleaved data unit DATA 202 and deinterleaved error correction code ECC 222. The deinterleaving process can be performed by writing portions of the storage data unit in a deinterleaved order into a buffer. An error decoding process can be performed to recover the correct data if one or more errors are present in the storage data unit. The error decoding process can start after the first data segment (segment size of the interleave level one) of the permutated data unit P(DATA) 204 is deinterleaved as illustrated by the latency $T_{segment}$. Hence, the buffer implemented for the deinterleaving process may have a size corresponding to a data segment of interleave level one.

The error decoding process may include performing an ECC decoding algorithm (e.g., LDPC decoding algorithm) on the deinterleaved data unit DATA 202, the checksum (e.g., CRC 212), and the deinterleaved ECC 222 in an attempt to recover the correct data. The ECC decoding algorithm may generate a decoded data unit $data_1$ $202a$ and a decoded checksum $crc_1$ $212a$ based on the deinterleaved ECC 222. For example, if the storage data unit has one or more correctable errors, the ECC decoding algorithm may correct the errors such that an ECC computed over the decoded data unit $data_1$ $202a$ and the decoded checksum $crc_1$ 212a corresponds to the deinterleaved ECC 222. If one or more errors occur in the ECC, the ECC decoding algorithm may determine a decoded error correction code $ecc_1$ 222a, and generate the decoded data unit $data_1$ 202a and the decoded checksum $crc_1$ 212a to correspond to the decoded error correction code $ecc_1$ 222a.

The decoded data unit $data_1$ 202a is then interleaved to generate a permutated decoded data unit $P(data_1)$ 204a. A verification checksum can then be computed over the permutated decoded data unit $P(data_1)$ 204a. The verification checksum is compared with the decoded checksum $crc_1$ 212a to determine whether the decoded data unit $data_1$ 202a corresponds to valid data (error-free data). If it is determined that the verification checksum computed over the permutated decoded data unit $P(data_1)$ 204a matches the decoded checksum $crc_1$ 212a, the decoded data unit $data_1$ 202a is outputted as valid data.

If it is determined that the verification checksum computed over the permutated decoded data unit $P(data_1)$ 204a does not match the decoded checksum $crc_1$ 212a as shown in FIG. 3, another iteration of error decoding can be performed on the deinterleaved data unit data unit DATA 202, the checksum (e.g., CRC 212), and the deinterleaved ECC 222. By way of example, the ECC decoding algorithm may include one or more hierarchal decoding algorithms. For instance, the hierarchal decoding algorithms may include one or more initial decoding attempts performed using a faster and/or less complex decoder (e.g., a bit-flipping (BF) decoder) before resorting to a slower and/or more complex decoder (e.g., a min-sum (MS) decoder) to resolve more difficult errors, etc.

The subsequent iteration of the ECC decoding algorithm may generate a decoded data unit $data_2$ 202b and a decoded checksum $crc_2$ 212b based on the deinterleaved ECC 222 (or a corrected error correction code ecce 222b). The decoded data unit $data_2$ 202b is then interleaved to generate a permutated decoded data unit $P(data_2)$ 204b. A verification checksum can then be computed over the permutated decoded data unit $P(data_2)$ 204b. The verification checksum is compared with the decoded checksum $crc_2$ 212b to determine whether the decoded data unit $data_2$ 202b corresponds to valid data (error-free data). If it is determined that the verification checksum computed over the permutated decoded data unit $P(data_2)$ 204b matches the decoded checksum $crc_2$ 212b, the decoded data unit $data_2$ 202b can be outputted as valid data as shown in FIG. 3.

If it is determined that the verification checksum computed over the permutated decoded data unit $P(data_2)$ 204b does not match the decoded checksum $crc_2$ 212b, a further iteration of error decoding can be performed. Error decoding iterations can be performed, for example, until the verification checksum matches the decoded checksum, or until the number of error decoding iterations has reached a threshold number. The threshold number of iterations can be set based on, for example, the amount of time that the storage system can tolerate for performing error correction, the criticality of the data being stored, and/or a data integrity quality-of-service for the storage system.

In some implementations, when the number of error decoding iterations has reached the threshold number of iterations, a defense algorithm can be executed to resolve the decoding failure. For example, the defense algorithm may include calibrating or adjusting the read bias to compensate for the error(s). However, the overhead for the read operation may increase, and the time required for the read operation may also increase. In some implementations, the memory location can also be marked as a bad location to prevent new data from being stored at that memory location.

Figure 4:
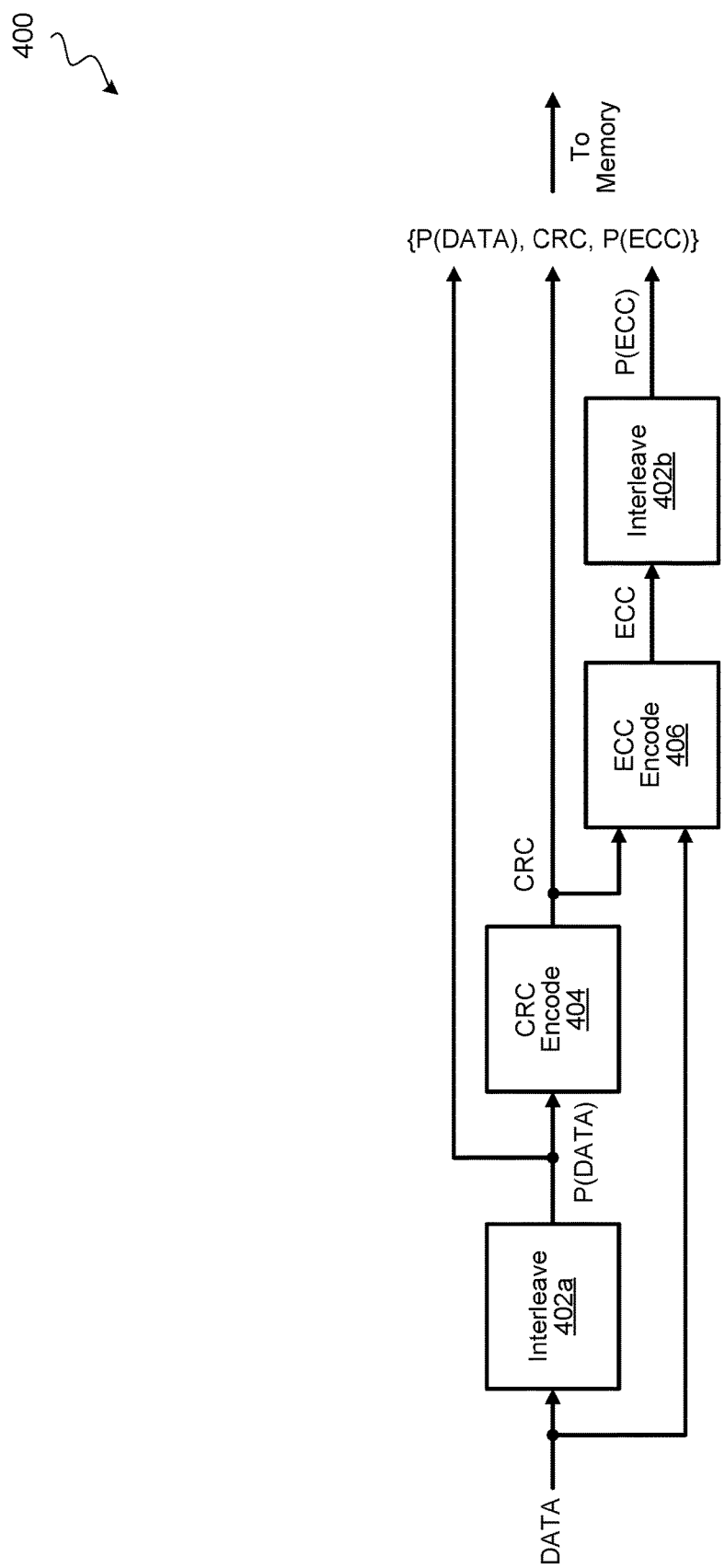
FIG. 4 illustrates a block diagram of the data flow for preparing data for storing to a storage device, according to some embodiments.

FIG. 4 illustrates a block diagram 400 of the data flow for preparing data for storing to a storage device, according to some embodiments. The original data DATA intended to be stored in the memory of the storage device can be provided, for example, from a host system. The original data DATA is inputted to an interleave function 402a. The interleave function 402a may include segmenting the original data DATA into data segments, and shuffling the data segments at the first interleave level. The interleave function 402a may further include shuffling data portions within each data segment at the second interleave level. Additional interleave levels can be performed to shuffle progressively smaller sub-portions of each data portion. The interleave function 402b can be performed, for example, by writing the various parts of the original data DATA into a buffer in a prescribed shuffling order to generate permutated data P(DATA).

The permutated data P(DATA) is then provided to a CRC encoding function 404 to compute a CRC checksum over the permutated data P(DATA). The CRC checksum and the original non-permutated data DATA are provided to an ECC encoding function 406 to generate an ECC. The ECC encoding function 406 can be, for example, a LDPC encoding function that generates a LDPC code over the original non-permutated data DATA and the CRC checksum. The generated ECC (e.g., LDPC code) is then shuffled by an interleave function 402b to generate a permutated ECC P(ECC). Interleave function 402b can be similar to interleave function 402a. In some implementations, interleave function 402b can be performed by the same logic block that performs interleave function 402a.

The permutated data P(DATA) generated by interleave function 402a, the CRC checksum generated by the CRC encoding function 404, and the permutated ECC P(ECC) generated by interleave function 402b are then concatenated together to generate a storage data unit {P(DATA), CRC, P(ECC)}. The storage data unit can then be written into the memory of the storage device.

Figure 5:
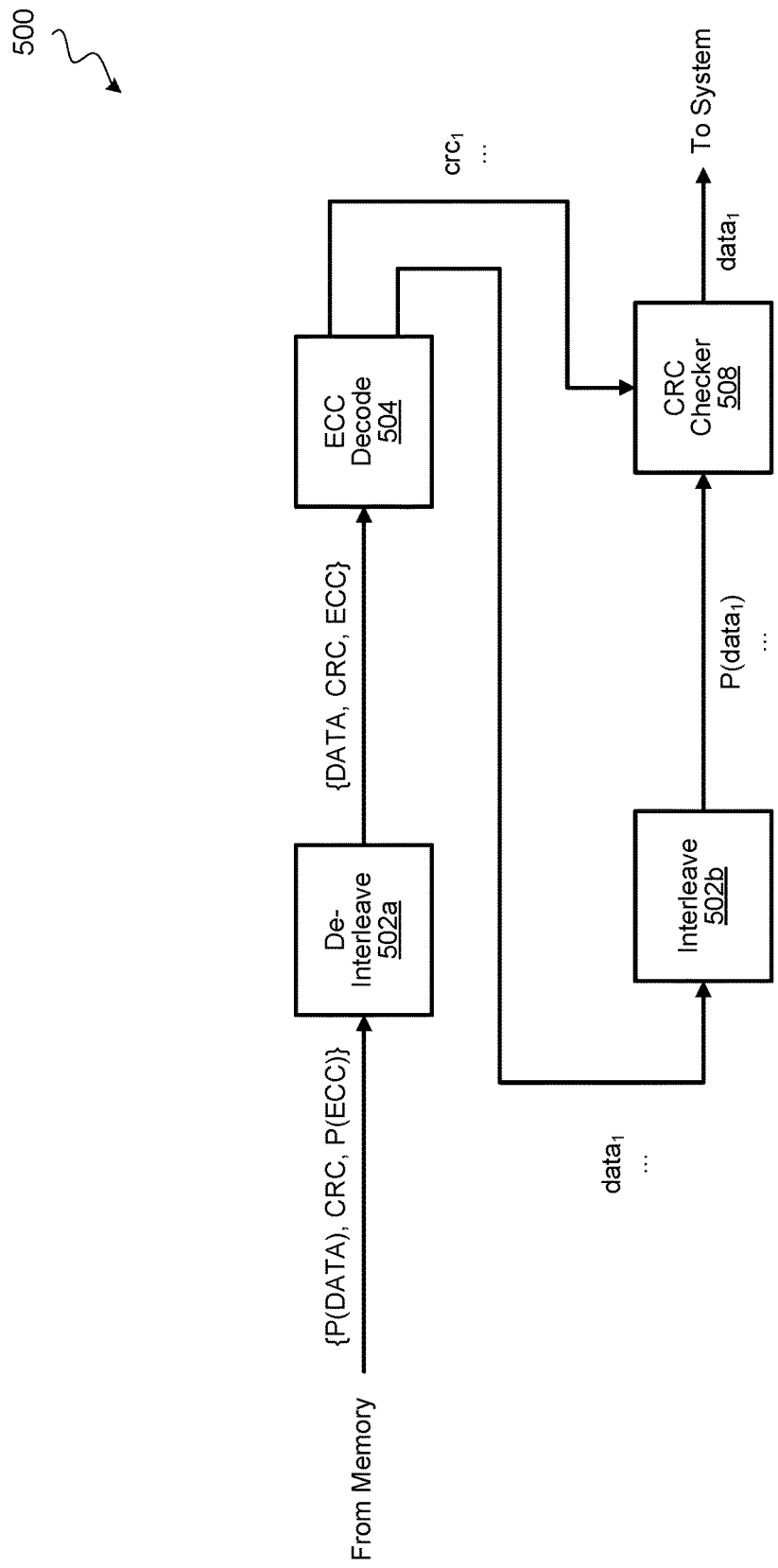
FIG. 5 illustrates a block diagram of the data flow for retrieving data from a storage device, according to some embodiments.

FIG. 5 illustrates a block diagram 500 of the data flow for retrieving data from a storage device, according to some embodiments. A storage data unit is read from the memory of the storage device. The storage data unit may include permutated data P(DATA), a CRC checksum, and a permutated ECC P(ECC). The storage data unit may include one or more bit errors. The storage data unit is provided to a de-interleave function 502a. The deinterleave function 502a shuffles the permutated data P(DATA) and the permutated ECC P(ECC) to rearrange these components of the storage data unit into their non-interleave order DATA and ECC. It should be noted that the buffer used for the de-interleaved function 502a can be sized to be one data segment long, and each data segment of the permutated data P(DATA) and the permutated ECC P(ECC) can be de-interleaved sequentially in the buffer.

The non-permutated data DATA, the CRC checksum, and the non-permutated ECC are then provided to an ECC decoding function 504. The ECC decoding function 504 determines if the non-permutated data DATA and the CRC checksum converges to the non-permutated ECC. If not, one or more errors may be present in the data storage unit read from memory. The ECC decoding function 504 may correct one or more data bits of the storage data unit to generate the decoded $data_1$, the decoded checksum $crc_1$, and the decoded ECC ecc1, such that the decoded $data_1$ and the decoded checksum $crc_1$ converges to the decoded ECC $ecc_1$.

Upon ECC convergence, the decoded $data_1$ is provided to an interleave function 502b to shuffle the decoded $data_1$ to generated permutated decoded data $P(data_1)$. The interleave function 502b can perform a similar multi-level interleaving as interleave function 402a. The permutated decoded data $P(data_1)$ generated by the interleave function 502b and the decoded checksum $crc_1$ generated by the ECC decoding function 504 are provided to a CRC checker function 508. The CRC checker function computes a verification CRC checksum over the permutated decoded data $P(data_1)$, and compares the computed verification CRC checksum with the decoded checksum $crc_1$. If CRC convergence is reached, the non-permutated decoded $data_1$ is outputted as valid data from the storage device to a host system. If CRC convergence is not reached, the data retrieval process may return to the ECC decoding function 504 to perform another error decoding iteration to generate another set of decoded storage data unit including decoded $data_2$, decoded checksum $crc_2$, and decoded ECC ecce. This process can repeat until CRC convergence is reached, or until a threshold number of error decoding iterations have been performed.

Figure 6:
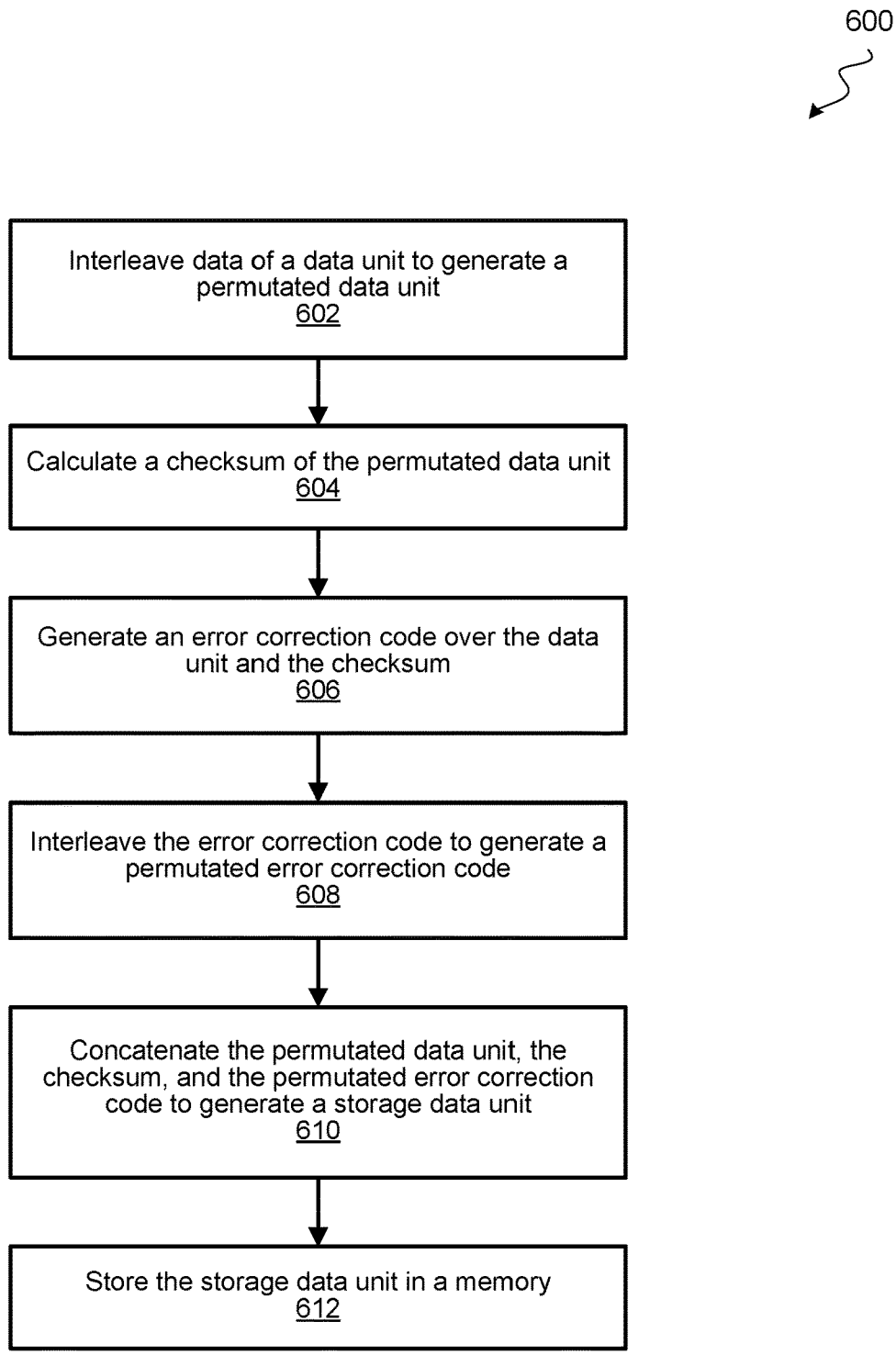
FIG. 6 illustrates a flow diagram of an example of a process for storing data to a storage device, according to some embodiments.

FIG. 6 illustrates a flow diagram of an example of a process 600 for storing data to a storage device, according to some embodiments. Process 600 can be performed, for example, by a memory controller of a memory of the storage device. In some implementations, process 600 can be implemented using circuitry in the memory controller, software code (e.g., firmware, error handling code, etc.) executed by a processor of the memory controller, or a combination of both.

Process 600 may begin at block 602 by interleaving data of a data unit to generate a permutated data unit. The data rearrangement performed at block 602 may include multi-level interleaving. For example, the multi-level interleaving can be a 2-level interleaving that includes segmenting the data unit into multiple data segments, and splitting each data segment into multiple data portions. The data segments can be interleaved at the first interleave level, and the data portions in each interleaved data segment can be interleaved at the second interleave level.

At block 604, a checksum of the permutated data unit is calculated. The checksum can be, for example, a cyclic redundancy check value. At block 606, an error correction code can be generated over the non-permutated data unit and the checksum calculated from block 604. The checksum can be, for example, a low-density parity-check code. It should be noted that the checksum is calculated over the permutated data unit, whereas the error correction code is generated over the non-permutated data unit. Providing a mechanism to verify both the permutated and non-permutated data can increase the confidence that the recovered data when reading from memory has both the correct values and ordering, and that errors are not introduced by the interleaving process.

At block 608, the error correction code is itself interleaved to generate a permutated error correction code. The error correction code is also interleaves because it may be possible for the consecutive bit errors to appear in the error correction code itself. The interleaving performed on the error correction code can be similar to the interleaving performed on the data unit.

At block 610, the permutated data unit, the checksum, and the permutated error correction code can be concatenated together to generate a storage data unit, and at block 612, the storage data unit can be stored in the memory of the storage device. For example, the storage data unit can be written to a memory such as a flash memory of a storage device.

Figure 7:
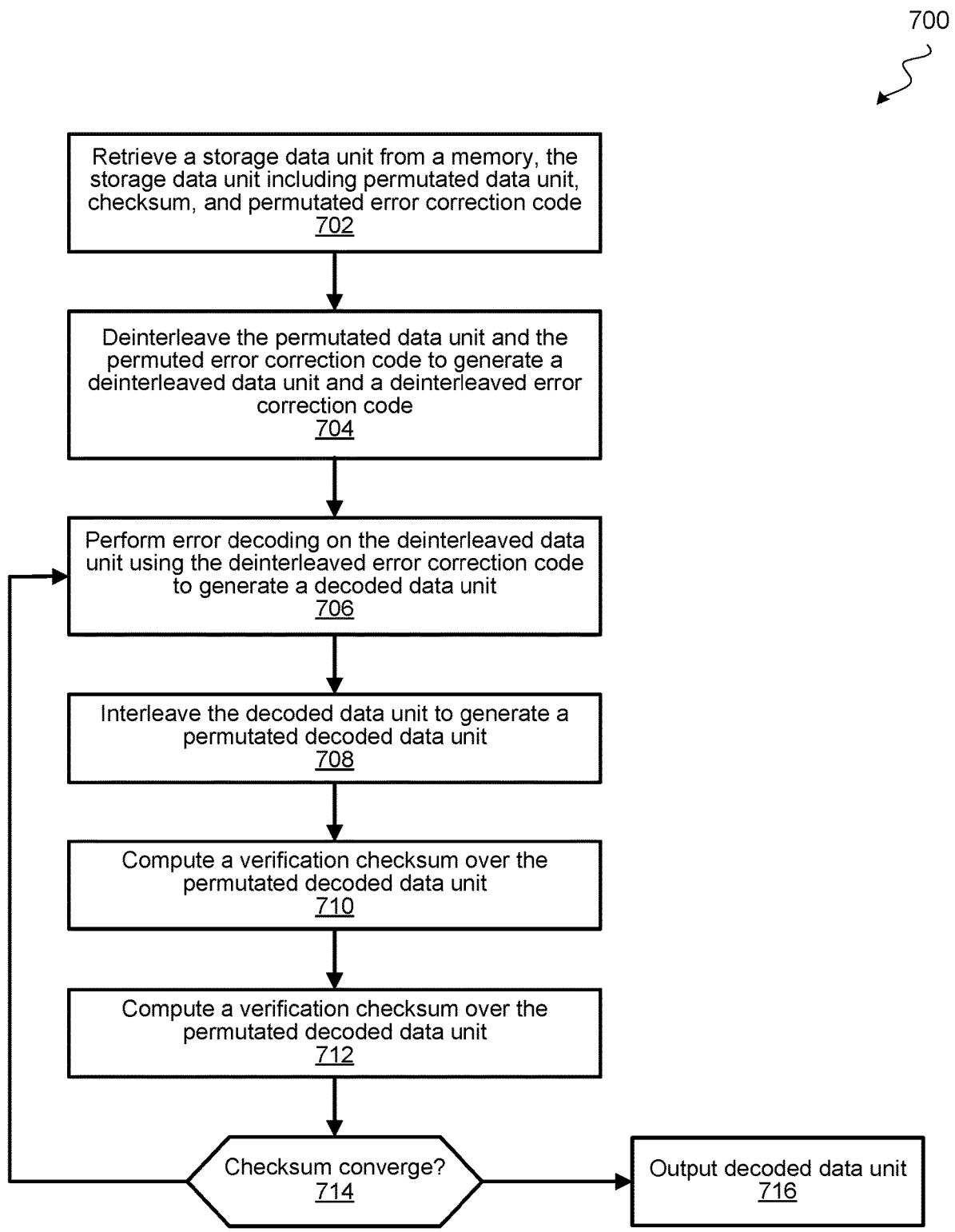
FIG. 7 illustrates a flow diagram of an example of a process for retrieving data from a storage device, according to some embodiments.

FIG. 7 illustrates a flow diagram of an example of a process 700 for retrieving data from a storage device, according to some embodiments. Process 700 can be performed, for example, by a memory controller of a memory of the storage device. In some implementations, process 700 can be implemented using circuitry in the memory controller, software code (e.g., firmware, error handling code, etc.) executed by a processor of the memory controller, or a combination of both.

Process 700 may begin at block 702 by retrieving a storage data unit from a memory. For example, the storage data unit can be retrieved in response to a host device requesting the data from the memory of a storage device. The storage data unit may include a permutated data unit, a checksum, and a permutated error correction code.

At block 704, the permutated data unit can be deinterleaved to generate a deinterleaved data unit, and the permuted error correction code can be deinterleaved to generate a deinterleaved error correction code. The deinterleaved data unit can be generated by segmenting the permutated data unit into multiple data segments, and deinterleaving the data segments. Each data segment may include interleaved data portions, and the deinterleaving process may further include deinterleaving the data portions in each data segment. Depending on the number of levels of interleaving that were performed when the data was stored in memory, the same number of levels of deinterleaving can be performed.

At block 706, error decoding can be performed on the deinterleaved data unit and the checksum using the deinterleaved error correction code to generate a decoded data unit and decoded checksum. The error decoding can be initiated after deinterleaving the first data segment of the permutated data unit. Hence, it is not necessary to incur the latency of deinterleaving the entire storage data unit before initiating the error decoding process, and the impact on the memory access latency for reading interleaved data can be minimized. The error decoding can be, for example, a LDPC decoding process.

At block 708, the decoded data unit is interleaved to generate a permutated decoded data unit. The decoded data unit is interleaved because the checksum is computed over the permutated data. Hence, to perform the checksum verification process, the decoded data unit is interleaved to put the data in proper sequence for the checksum computation.

At block 710, a verification checksum is computed over the permutated decoded data unit. At block 712, the verification checksum is compared with the decoded checksum to determine whether the decoded data unit corresponds to valid data to achieve checksum convergence. If it is determined that the verification checksum does not match the decoded checksum (checksums do not converge), process 700 returns to block 706 to perform another iteration of error decoding on the deinterleaved data unit using the deinterleaved error correction code. Blocks 706-714 can be repeated for each iteration of error decoding until checksum convergence is achieved. In some implementations, blocks 706-714 can be repeated until a threshold number of error decoding iterations is reached to limit the error decoding latency. Upon reaching the threshold limit, a defense algorithm can be executed to mitigate against a potentially uncorrectable error.

Referring back to block 714, if it is determined that the verification checksum matches the decoded checksum to achieve checksum convergence, process 700 can proceed to block 716 to output the decoded data unit.

Figure 8:
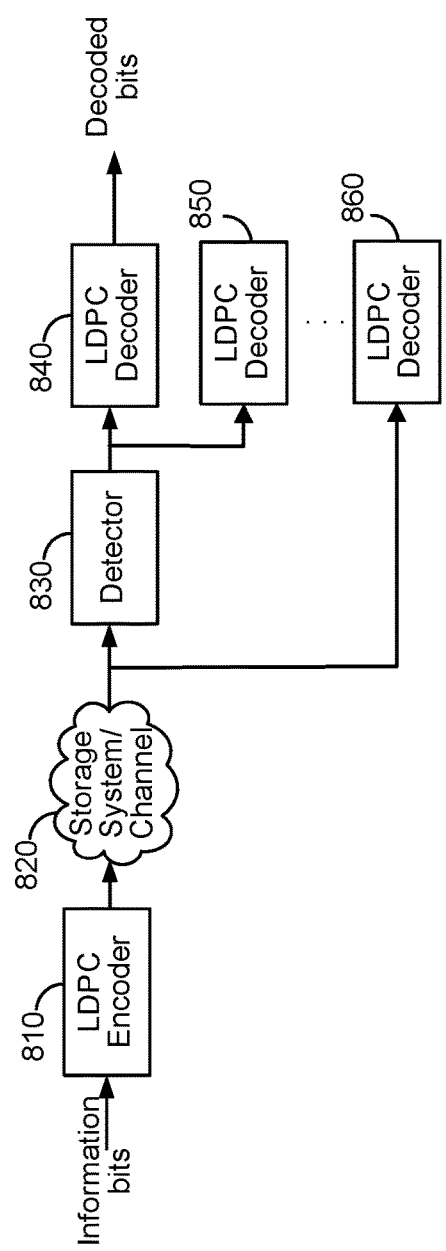
FIG. 8 illustrates an example high level block diagram of an error correction system, in according to some embodiments.

FIG. 8 illustrates an example high level block diagram of an error correction system 800, in accordance with certain embodiments. The data interleave techniques described above can be implemented in error correction system 800 to improve error correction for burst errors in the user data. In the example, low-density parity-check (LDPC) codes are described in connection with data storage. However, the embodiments of the present disclosure are not limited as such. Instead, the embodiments similarly apply to other usages of LDPC codes including, for example, data transmission. Further, the embodiments of the present disclosure can similarly apply to other error correction codes.

LDPC codes are linear block codes defined by a sparse parity-check matrix H, which consists of zeros and ones. The term "sparse matrix" is used herein to refer to a matrix in which a number of non-zero values in each column and each row is much less than its dimension. The term "column weight" is used herein to refer to the number of non-zero values in a specific column of the parity-check matrix H. The term "row weight" is used herein to refer to a number of non-zero values in a specific row of the parity-check matrix H. In general, if column weights of all the columns in a parity-check matrix corresponding to an LDPC code are similar, the code is referred to as a "regular" LDPC code. On the other hand, an LDPC code is called "irregular" if at least one of the column weights is different from other column weights. Usually, irregular LDPC codes provide better error correction capability than regular LDPC codes.

LDPC codes are also classified according to the way they are constructed. Random computer searches or algebraic constructions are possible. The random computer search construction describes an LDPC code having a parity-check matrix designed by a random computer-based procedure. Algebraic construction implies that the parity-check matrix has been constructed based on combinatorial methods. Quasi-cyclic LDPC (QC-LDPC) codes fall under the latter construction method. One advantage of QC-LDPC codes is that they have a relatively easier implementation in terms of the encoding procedure. The main feature of QC-LDPC codes is that the parity-check matrix consists of circulant submatrices, which could be either based on an identity matrix or a smaller random matrix. Permutation vectors could also be used in order to create the circulant submatrices.

As illustrated, an LDPC encoder 810 receives information bits that include data which is to be stored in a storage system 820. LDPC encoded data is outputted by the LDPC encoder 810 and is written to the storage system 820. In various embodiments, the storage system 220 may include a variety of storage types or media such as (e.g., magnetic) disk drive storage, flash storage, etc. In some embodiments, the techniques are employed in a transceiver and instead of being written to or read from storage, the data is transmitted and received over a wired and/or wireless channel. In this case, the errors in the received codeword may be introduced during transmission of the codeword.

When the stored data is requested or otherwise desired (e.g., by an application or user which stored the data), a detector 830 receives data from the storage system 820. The received data may include some noise or errors. The detector 830 performs detection on the received data and outputs decision and/or reliability information. For example, a soft output detector outputs reliability information and a decision for each detected bit. On the other hand, a hard output detector outputs a decision on each bit without providing corresponding reliability information. As an example, a hard output detector may output a decision that a particular bit is a "1" or a "0" without indicating how certain or sure the detector is in that decision. In contrast, a soft output detector outputs a decision and reliability information associated with the decision. In general, a reliability value indicates how certain the detector is in a given decision. In one example, a soft output detector outputs a log-likelihood ratio (LLR) where the sign indicates the decision (e.g., a positive value corresponds to a "1" decision and a negative value corresponds to a "0" decision) and the magnitude indicates how certain the detector is in that decision (e.g., a large magnitude indicates a high reliability or certainty).

The decision and/or reliability information is passed to an LDPC decoder 840 which performs LDPC decoding using the decision and reliability information. A soft input decoder utilizes both the decision and the reliability information to decode the codeword. A hard decoder utilizes only the decision values in the decoder to decode the codeword. The decoded bits generated by the LDPC decoder 840 are passed to the appropriate entity (e.g., the user or application which requested it). With proper encoding and decoding, the information bits match the decoded bits.

Although the output of the detector 830 may be beneficial for some LDPC decoders, not all error correction systems are configured with a detector. Further, the processing performed by detector 830 may be computation intensive, especially in regard to computing reliability information, which could significantly offset the advantages of using faster decoders such as BF decoders. Accordingly, in some implementations, LLR or other reliability information provided by a detector such as the detector 830 is not used as input to a BF decoder. Instead, the BF decoder may be configured to determine reliability for itself, e.g., through identifying unreliable check nodes using the techniques described below. However, the output of detector 830 may still be used for generating input to other decoders in the error correction system. The error correction system 800 may include multiple ECC or LDPC decoders that form a decoder hierarchy in which decoding is first attempted using a faster and/or less complex decoder (e.g., a BF decoder) before resorting to a slower and/or more complex decoder (e.g., an MS decoder). Accordingly, the error correction system 800 may include one or more additional LDPC decoders (e.g., an LDPC decoder 850 and an LDPC decoder 860), where at least some of the additional LDPC decoders do not receive output of the detector 830 (e.g., the LDPC decoder 860, as shown in FIG. 8). Further, in the case of a BF decoder implemented in accordance with one or more embodiments described herein, such a BF decoder may optionally be configured to use decision information from a detector such as the detector 830.

In various embodiments, an error correction system such as the system 800 in FIG. 8 may be implemented using a variety of techniques including an application-specific integrated circuit (ASIC), a field-programmable gate array (FPGA), and/or a general purpose processor (e.g., an Advanced RISC Machine (ARM) core).

LDPC codes are usually represented by bipartite graphs. One set of nodes, the variable nodes (VNs, also referred to as bit nodes) correspond to elements of the codeword and the other set of nodes, e.g., check nodes (CNs), correspond to the set of parity-check constraints satisfied by the codeword. Typically, the edge connections are chosen at random. The error correction capability of an LDPC code is improved if cycles of short length are avoided in the graph. In an (r,c) regular code, each of the n variable nodes (e.g., V0, V1, V2 . . . Vn−1) has connections to r check nodes, and each of the m check nodes (e.g., C0, C1, C2 . . . Cm−1) has connections to c variable nodes. Each check node represents a separate parity-check equation. Thus, r corresponds to the number of parity-check equations involving each code bit and also the degree of each variable node. Similarly, c corresponds to the number of code bits involved in each parity-check equation and also the degree of each check node. The number of variable nodes (n) corresponds to the total number of bits (data and parity) in the code (the codeword length).

In an irregular LDPC code, the check node degree is not uniform. Similarly, the variable node degree is not uniform. In QC-LDPC codes, the parity-check matrix H can be structured into blocks of p×p matrices such that a bit in a block participates in only one parity-check equation in the block, and each parity-check equation in the block involves only one bit from the block. In QC-LDPC codes, a cyclic shift of a codeword by p results in another codeword. Here p is the size of a square matrix which is either a zero matrix or a circulant matrix. This is a generalization of a cyclic code in which a cyclic shift of a codeword by 1 results in another codeword. The block of p×p matrix can be a zero matrix or cyclically shifted identity matrix of size p×p.

Figures 9A, 9B:
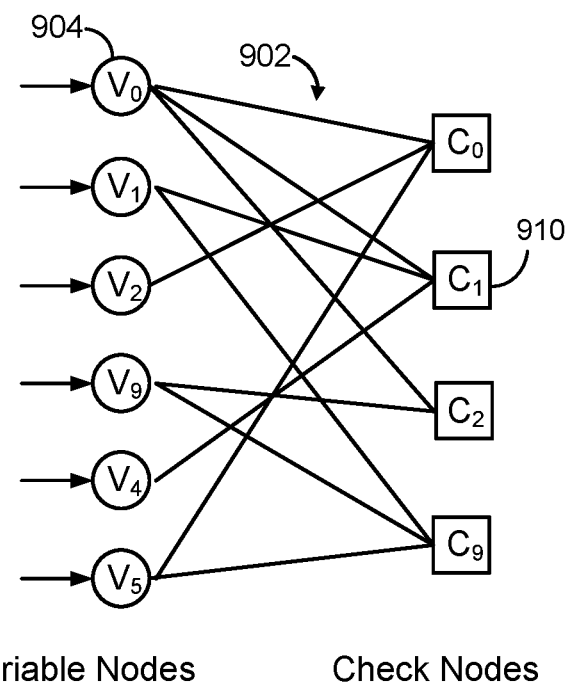
FIG. 9A illustrates an example parity-check matrix, according to some embodiments.
FIG. 9B illustrates an example bipartite graph, according to some embodiments.

FIG. 9A illustrates an example parity-check matrix H 900 and FIG. 9B illustrates an example bipartite graph corresponding to the parity-check matrix 900, in accordance with certain embodiments of the present disclosure. In this example, the parity-check matrix 900 has six column vectors and four row vectors. In practice, parity-check matrices tend to be much larger. Network 902 forms a bipartite graph representing the parity-check matrix 900. Various type of bipartite graphs are possible, including, for example, a Tanner graph.

Generally, the variable nodes in the network 902 correspond to the column vectors in the parity-check matrix 900. The check nodes in the network 902 correspond to the row vectors of the parity-check matrix 900. The interconnections between the nodes are determined by the values of the parity-check matrix 900. Specifically, a "1" indicates that the CN and VN at the corresponding row and column position have a connection. A "0" indicates there is no connection. For example, the "1" in the leftmost column vector and the second row vector from the top in the parity-check matrix 900 corresponds to the connection between a VN 904 and a CN 910 in FIG. 9B. Collectively, the check nodes represent a syndrome computed through applying the parity-check equations represented by the parity-check matrix 900 to the received codeword. A syndrome weight (also known as a checksum) can be computed by summing together the bit-values of all the check nodes.

A message passing algorithm is generally used to decode LDPC codes. Several variations of the message passing algorithm exist in the art, such as min-sum (MS) algorithm, sum-product algorithm (SPA) or the like. Message passing uses a network of variable nodes and check nodes, as shown in FIG. 9B. The connections between variable nodes and check nodes are described by and correspond to the values of the parity-check matrix 900, as shown in FIG. 9A. The content of a message passed from a variable node to a check node or vice versa depends on the message passing algorithm used.

A hard decision message passing algorithm may be performed in some instances. In a first step, each of the variable nodes sends a message to one or more check nodes that are connected to it. In this case, the message is a value that each of the variable nodes believes to be its correct value. The values of the variable nodes may be initialized according to the received codeword.

In the second step, each of the check nodes calculates a response to send to the variable nodes that are connected to it using the information that it previously received from the variable nodes. This step can be referred to as the check node update (CNU). The response message corresponds to a value that the check node believes that the variable node should have based on the information received from the other variable nodes connected to that check node. This response is calculated using the parity-check equations which force the values of all the variable nodes that are connected to a particular check node to sum up to zero (modulo 2).

At this point, if all the equations at all the check nodes are satisfied, meaning the value of each check node is zero, then the resulting checksum is also zero, so the decoding algorithm declares that a correct codeword is found and decoding terminates. If a correct codeword is not found (e.g., the value of any check node is one), the iterations continue with another update from the variable nodes using the messages that they received from the check nodes to decide if the bit at their position should be a zero or a one, e.g., using a majority voting rule in which the value of a variable node is set to the value of a majority of the check nodes connected to the variable node. The variable nodes then send this hard decision message to the check nodes that are connected to them. The iterations continue until a correct codeword is found, a certain number of iterations are performed depending on the syndrome of the codeword (e.g., of the decoded codeword), or a maximum number of iterations are performed without finding a correct codeword. It should be noted that a soft-decision decoder works similarly, however, each of the messages that are passed among check nodes and variable nodes can also include reliability information for each bit.

Figure 10:
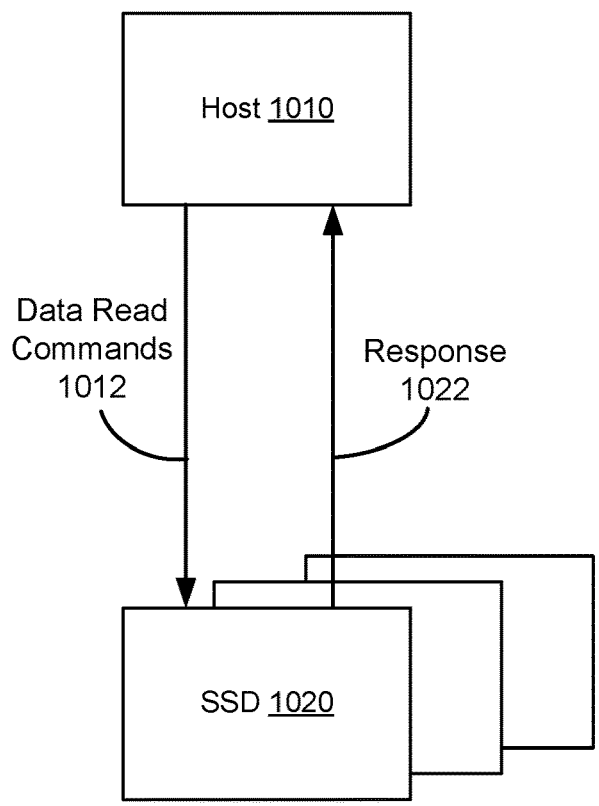
FIG. 10 illustrates a simplified block diagram of a computing system, according to some embodiments.

FIG. 10 illustrates an example architecture of a computing system 1000, in accordance with certain embodiments of the present disclosure. In an example, the computer system 1000 includes a host 1010 and one or more solid state drives (SSDs) 1020. The host 1010 stores data on behalf of clients, e.g., the SSDs 1020. The data is stored in an SSD as codewords for ECC protection. For instance, the SSD can include an error correction system comprising one or more ECC encoders (e.g., the LDPC encoder 810 of FIG. 8).

The host 1010 can receive a request from a client for the client's data stored in the SSDs 1000. In response, the host sends data read commands 1012 to the SSDs 1020 as applicable. Each of the SSDs 1020 processes the received data read command and sends a response 1022 to the host 1010 upon completion of the processing. The response 1022 can include the read data and/or a decoding failure. In an example, each of the SSDs includes at least one ECC decoder (e.g., one or more of the LDPC decoders in FIG. 8). Further, at least one of the SSDs 1020 may include a BF decoder. In particular, some or all of the SSDs 1020 may include a BF decoder that takes into account information about unreliable check nodes when deciding whether to flip the bit-value of a variable node, where the information about unreliable check nodes is determined through building a set of unreliable check nodes using the techniques described below.

Processing the data read command and sending the response 1022 includes decoding by the ECC decoder(s) the codewords stored in the SSD to output the read data and/or the decoding failure. Some of the codewords may be decoded by a BF decoder, or some other decoding technique applied to circulant submatrices.

In an example where an SSD 1020 includes a BF decoder and one or more additional ECC decoders, the SSD may be configured to attempt an initial decoding of its stored codewords using the BF decoder. The one or more additional ECC decoders can remain inactive while the BF decoder is decoding. If the decoding by the BF decoder is unsuccessful, the SSD may select one of the additional ECC decoders (e.g., based on a hierarchical order) for performing decoding. Thus, the one or more additional ECC decoders may act as backup decoders in the event that the BF decoder cannot fully decode a codeword. A backup decoder need not process all the codewords input to the BF decoder. Instead, in some examples, the input to a backup decoder is a subset of the input to a previously selected decoder, where the subset corresponds to codewords that the previously selected decoder failed to fully decode. Further, some of the additional ECC decoders may be operated in parallel with the BF decoder to perform parallel processing of codewords. For example, as discussed below in connection with FIG. 11, an incoming set of codewords can be distributed across a BF decoder and an MS decoder so that each decoder processes a distinct subset of codewords.

Generally, an SSD can be a storage device that stores data persistently or caches data temporarily in nonvolatile semiconductor memory and is intended for use in storage systems, servers (e.g., within datacenters), and direct-attached storage (DAS) devices. A growing number of applications need high data throughput and low transaction latency, and SSDs are used as a viable storage solution to increase performance, efficiency, and reliability. SSDs generally use NAND flash memory and deliver higher performance and consume less power than spinning hard-disk drives (HDDs). NAND Flash memory has a number of inherent issues associated with it, the two most important include a finite life expectancy as NAND Flash cells wear out during repeated writes, and a naturally occurring error rate. SSDs can be designed and manufactured according to a set of industry standards that define particular performance specifications, including latency specifications, to support heavier write workloads, more extreme environmental conditions and recovery from a higher bit error rate (BER) than a client SSD (e.g., personal computers, laptops, and tablet computers).

Figure 11:
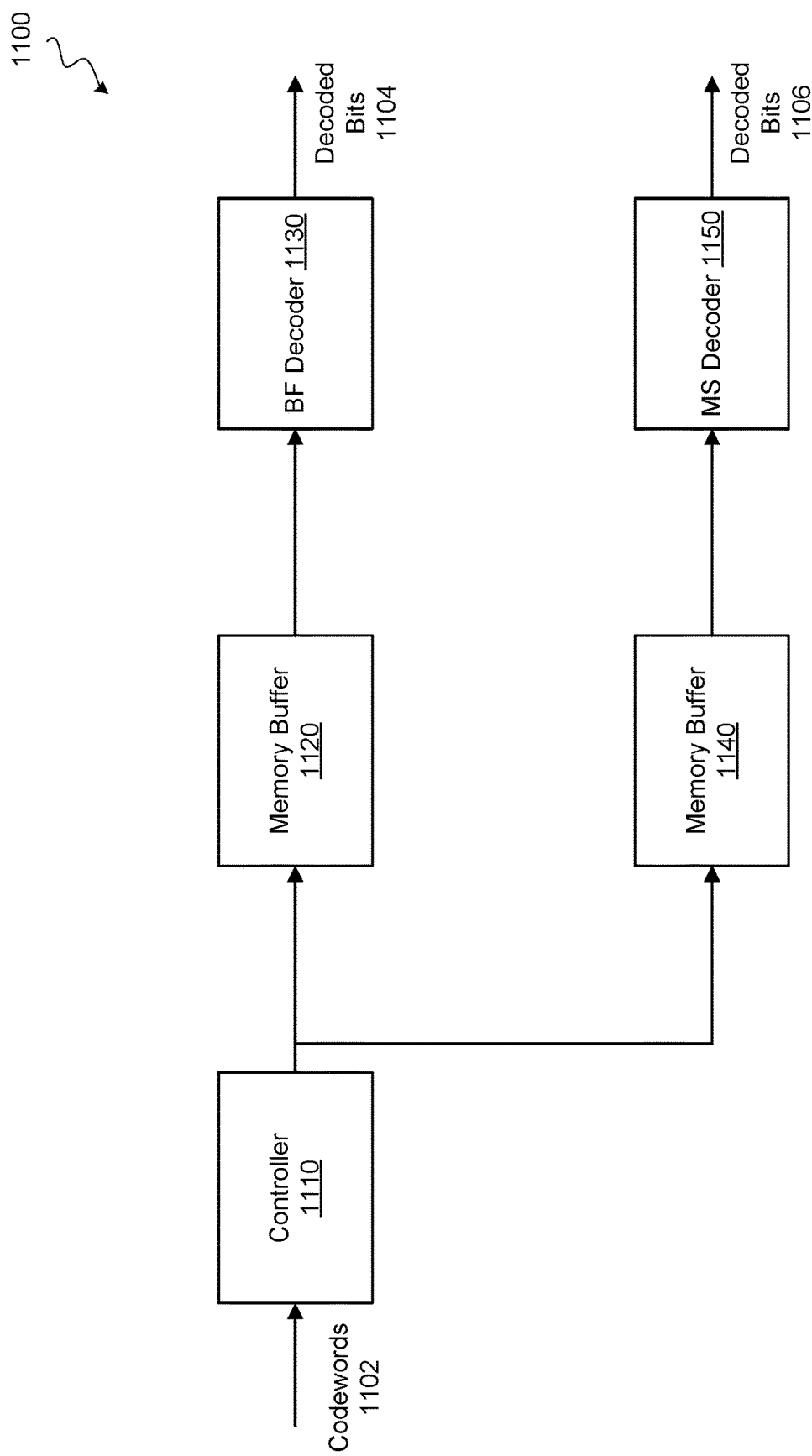
FIG. 11 illustrates an example error correction system that includes multiple decoders, according to some embodiments.

FIG. 11 illustrates an example error correction system 1100 that includes multiple ECC decoders, in accordance with certain embodiments of the present disclosure. The error correction system 1100 can be included in a memory device, such as an SSD 1020 of FIG. 10. In turn, the error correction system 1100 includes a controller 1110, a memory buffer 1120 corresponding to a BF decoder 1130, and a memory buffer 1140 corresponding to a min-sum (MS) decoder 1150. The controller 1110 can determine which of the two decoders 1130 and 1150 are to be used to decode different codewords 1102 based on an estimate of the number of raw bit-errors for each of the codewords. The bit-errors can be due to noise and, accordingly, the codewords 1102 can include noisy codewords. The BF decoder 1130 outputs decoded bits 1104 corresponding to one or more of the codewords 1102, where the decoded bits 1104 remove some or all of the noise (e.g., correct the error bits). Similarly, the MS decoder 1150 outputs decoded bits 1106 corresponding to remaining one or more of the codewords 1102, where the decoded bits 1106 remove some or all of the noise (e.g., correct the error bits).

If the controller 1110 determines that a codeword has a severe bit error rate, a decoding failure is likely with the two decoders 1130 and 1150. In such instances, and assuming that the only decoders in the error correction system 1100 are the decoders 1130 and 1150, the controller 1110 may skip decoding altogether to, instead, output an error message. Otherwise, the codeword can be dispatched to the BF decoder 1130 when the controller 1110 determines that the bit-error rate falls within the error correction capability of the BF decoder 1130. Alternatively, the codeword can be dispatched to the MS decoder 1150 when the controller 1110 determines that the bit-error rate is outside the error correction capability of the BF decoder 1130 but within the error correction capability of the MS decoder 1150. Dispatching the codeword includes storing the codeword into one of the memory buffers 1120 or 1140 depending on the controller's 1110 determination. The memory buffers 1120 and 1140 are used because, in certain situations, the decoding latency is slower than the data read rate of a host reading the codewords 1102.

Accordingly, over time, the codewords 1102 are stored in different input queues for the BF decoder 1130 and the MS decoder 1150. For typical SSD usage, it is expected that most traffic would go to the BF decoder 1130. Hence, it is important that the BF decoder's performance is improved. Although FIG. 11 illustrates only one low latency and high throughput decoder (BF decoder 1130) and one high error correction capability decoder (MS decoder 1150), a different number of decoders can be used. For instance, a second BF decoder can be also used and can have the same or a different configuration than the BF decoder 1130.

Figure 12:
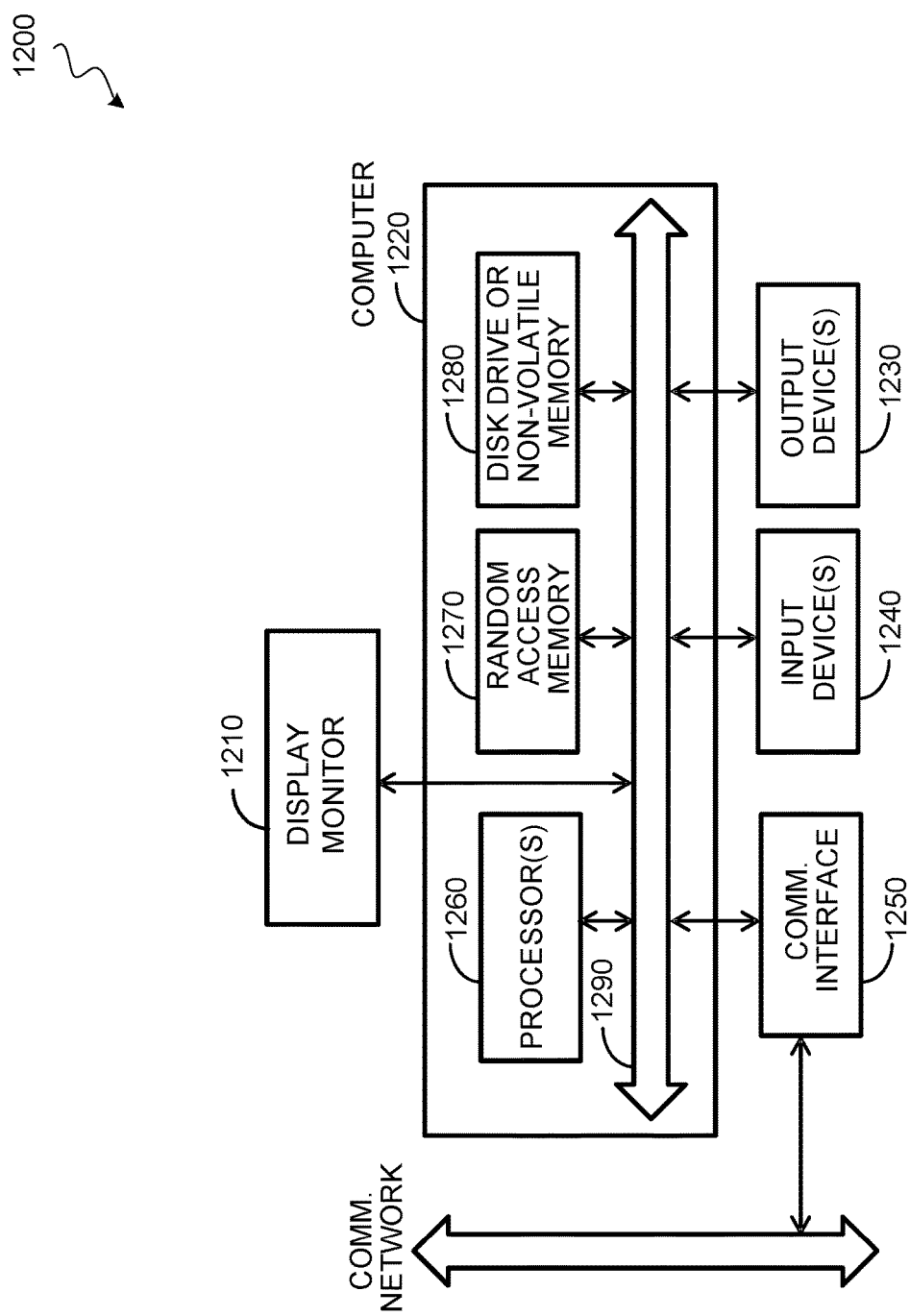
FIG. 12 illustrates a block diagram of a computer system, according to some embodiments.

FIG. 12 illustrates a computer system 1200 usable for implementing one or more embodiments of the present disclosure. FIG. 12 is merely an example and does not limit the scope of the disclosure as recited in the claims. As shown in FIG. 12, the computer system 1200 may include a display monitor 1210, a computer 1220, user output devices 1230, user input devices 1240, a communications interface 1250, and/or other computer hardware or accessories. The computer system 1200 or select components of the computer system 1200 can be used to implement the error correction system 800 of FIG. 8 and/or the error correction system 1100 of FIG. 11.

As shown in FIG. 12, the computer 1220 may include one or more processors 1260 that communicate with a number of peripheral devices via a bus subsystem 1290. These peripheral devices may include the user output devices 1230, the user input devices 1240, the communications interface 1250, and a storage subsystem, such as a random-access memory (RAM) 1270 and a disk drive or non-volatile memory 1280.

The user input devices 1240 include all possible types of devices and mechanisms for inputting information to the computer 1220. These may include a keyboard, a keypad, a touch screen incorporated into the display, audio input devices such as voice recognition systems, microphones, and other types of input devices. In various embodiments, the user input devices 1240 are typically embodied as a computer mouse, a trackball, a track pad, a joystick, a wireless remote, a drawing tablet, a voice command system, an eye tracking system, and the like. The user input devices 1240 typically allow a user to select objects, icons, text and the like that appear on the monitor 1210 via a command such as a click of a button or the like.

The user output devices 1230 include all possible types of devices and mechanisms for outputting information from the computer 1220. These may include a display (e.g., the monitor 1010), non-visual displays such as audio output devices, etc.

The communications interface 1250 provides an interface to other communication networks and devices. The communications interface 1250 may serve as an interface for receiving data from and transmitting data to other systems. Embodiments of the communications interface 1250 typically include an Ethernet card, a modem (telephone, satellite, cable, ISDN), (asynchronous) digital subscriber line (DSL) unit, FireWire interface, USB interface, and the like. For example, the communications interface 1250 may be coupled to a computer network, to a FireWire bus, or the like. In other embodiments, the communications interfaces 1250 may be physically integrated on the motherboard of the computer 1220, and may be a software program, such as soft DSL, or the like.

In various embodiments, the computer system 1200 may also include software that enables communications over a network such as the HTTP, TCP/IP, RTP/RTSP protocols, and the like. In alternative embodiments of the present disclosure, other communications software and transfer protocols may also be used, for example IPX, UDP or the like.

The RAM 1270 and the disk drive 1280 are examples of tangible media configured to store data such as embodiments of the present disclosure, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. The RAM 1270 and the disk drive 1280 may be configured to store the basic programming and data constructs that provide the functionality of the present disclosure.

Software code modules and instructions that provide the functionality of the present disclosure may be stored in the RAM 1270 and the disk drive 1280. These software modules may be executed by the processor(s) 1260. The RAM 1270 and the disk drive 1280 may also provide a repository for storing data used in accordance with the present disclosure.

The RAM 1270 and the disk drive 1280 may include a number of memories including a main random-access memory (RAM) for storage of instructions and data during program execution and a read-only memory (ROM) in which fixed non-transitory instructions are stored.

The RAM 1270 and the disk drive 1080 may include a file storage subsystem providing persistent (non-volatile) storage for program and data files. The RAM 1270 and the disk drive 1280 may also include removable storage systems, such as removable flash memory.

The bus subsystem 1290 provides a mechanism for letting the various components and subsystems of the computer 1220 communicate with each other as intended. Although the bus subsystem 1290 is shown schematically as a single bus, alternative embodiments of the bus subsystem may utilize multiple busses.

It will be readily apparent to one of ordinary skill in the art that many other hardware and software configurations are suitable for use with the present disclosure. For example, the computer 1220 may be a desktop, portable, rack-mounted, or tablet configuration. Additionally, the computer 1220 may be a series of networked computers. In still other embodiments, the techniques described above may be implemented upon a chip or an auxiliary processing board.

Various embodiments of the present disclosure can be implemented in the form of logic in software or hardware or a combination of both. The logic may be stored in a computer-readable or machine-readable non-transitory storage medium as a set of instructions adapted to direct a processor of a computer system to perform a set of steps disclosed in embodiments of the present disclosure. The logic may form part of a computer program product adapted to direct an information-processing device to perform a set of steps disclosed in embodiments of the present disclosure.

Based on the disclosure and teachings provided herein, a person of ordinary skill in the art will appreciate other ways and/or methods to implement the present disclosure.

The data structures and code described herein may be partially or fully stored on a computer-readable storage medium and/or a hardware module and/or hardware apparatus. A computer-readable storage medium includes, but is not limited to, volatile memory, non-volatile memory, and magnetic and optical storage devices, such as disk drives, magnetic tape, CDs, DVDs, or other media, now known or later developed, that are capable of storing code and/or data. Hardware modules or apparatuses described herein include, but are not limited to, ASICs, FPGAs, dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

The embodiments disclosed herein are not to be limited in scope by the specific embodiments described herein. Various modifications of the embodiments of the present disclosure, in addition to those described herein, will be apparent to those of ordinary skill in the art from the foregoing description and accompanying drawings. Further, although some of the embodiments of the present disclosure have been described in the context of a particular implementation in a particular environment for a particular purpose, those of ordinary skill in the art will recognize that the disclosure's usefulness is not limited thereto and that the embodiments of the present disclosure can be beneficially implemented in any number of environments for any number of purposes.

What is claimed is:

1. A method comprising:
   interleaving data of a data unit to generate a permutated data unit;
   calculating a checksum of the permutated data unit;
   generating an error correction code over the data unit and the checksum;
   interleaving the error correction code to generate a permutated error correction code;
   concatenating the permutated data unit, the checksum, and the permutated error correction code to generate a storage data unit; and
   storing the storage data unit in a semiconductor memory, wherein bit errors detected at retrieval of the storage data unit from the semiconductor memory are corrected by performing error correction on the storage data unit.

2. The method of claim 1, wherein interleaving the data of the data unit includes performing multi-level interleaving.

3. The method of claim 2, wherein the multi-level interleaving includes:
   segmenting the data unit into multiple data segments, each data segment including multiple data portions;
   interleaving the data segments; and
   interleaving the data portions in each interleaved data segment.

4. The method of claim 1, wherein the error correction code is a low-density parity-check (LDPC) code.

5. A method comprising:
retrieving a storage data unit from a semiconductor memory, the storage data unit including a permutated data unit, a checksum, and a permutated error correction code; and
performing error correction on the storage data unit by:
deinterleaving the permutated data unit to generate a deinterleaved data unit;
deinterleaving the permutated error correction code to generate a deinterleaved error correction code;
performing error decoding on the deinterleaved data unit and the checksum using the deinterleaved error correction code to generate a decoded data unit and a decoded checksum;
interleaving the decoded data unit to generate a permutated decoded data unit;
computing a verification checksum over the permutated decoded data unit; and
comparing the verification checksum with the decoded checksum to determine whether the decoded data unit corresponds to valid data.

6. The method of claim 5, wherein the permutated data unit is generated by:
segmenting a data unit into multiple data segments, each data segment including multiple data portions; and
interleaving the data segments.

7. The method of claim 6, wherein the permutated data unit is further generated by:
interleaving the data portions in each data segment.

8. The method of claim 6, wherein the error decoding is initiated after deinterleaving a first data segment of the permutated data unit.

9. The method of claim 5, further comprising:
determining that the verification checksum matches the decoded checksum; and
outputting the decoded data unit as valid data.

10. The method of claim 5, further comprising:
determining that the verification checksum does not match the decoded checksum; and
performing another iteration of error decoding on the deinterleaved data unit using the deinterleaved error correction code.

11. The method of claim 5, wherein the error decoding is one of a plurality of error decoding iterations that are performed until the verification checksum matches the checksum, or until a number of error decoding iterations reaches a threshold.

12. The method of claim 11, further comprising:
executing a defense algorithm when the number of error decoding iterations reaches the threshold.

13. The method of claim 5, wherein the deinterleaved error correction code is a low-density parity-check (LDPC) code.

14. A storage device comprising:
a semiconductor memory; and
a controller operable to:
receive a data unit for storing into the semiconductor memory;
perform interleaving of data in the data unit to generate a permutated data unit;
calculate a checksum of the permutated data unit;
generate an error correction code over the data unit and the checksum;
interleave the error correction code to generate a permutated error correction code;
concatenate the permutated data unit, the checksum, and the permutated error correction code to generate a storage data unit; and
write the storage data unit into the semiconductor memory, wherein bit errors detected at retrieval of the storage data unit from the semiconductor memory are corrected by performing error correction on the storage data unit.

15. The storage device of claim 14, wherein the interleaving of the data in the data unit includes k-level interleaving, k being an integer greater than one.

16. The storage device of claim 15, wherein the k-level interleaving includes:
segmenting the data unit into multiple data segments, each data segment including multiple data portions;
interleaving the data segments; and
interleaving the data portions in each interleaved data segment.

17. The storage device of claim 14, wherein the controller is further operable to:
retrieve the storage data unit from the semiconductor memory;
deinterleave the permutated data unit to generate a deinterleaved data unit;
deinterleave the permutated error correction code to generate a deinterleaved error correction code;
perform error decoding on the deinterleaved data unit and the checksum using the deinterleaved error correction code to generate a decoded data unit and decoded checksum;
interleave the decoded data unit to generate a permutated decoded data unit;
compute a verification checksum over the permutated decoded data unit; and
compare the verification checksum with the decoded checksum to determine whether the decoded data unit corresponds to valid data.

18. The storage device of claim 17, wherein the error decoding is one of a plurality of error decoding iterations that are performed until the verification checksum matches the checksum, or until a number of error decoding iterations reaches a threshold.

19. The storage device of claim 14, wherein the error correction code is a low-density parity-check (LDPC) code.

20. The storage device of claim 14, wherein the semiconductor memory includes one or more flash memory devices.

* * * * *